United States Patent
Koshida et al.

(10) Patent No.: US 12,393,220 B2
(45) Date of Patent: Aug. 19, 2025

(54) SUBSTRATE CURRENT SUPPRESSION CIRCUIT, REFERENCE VOLTAGE GENERATION CIRCUIT, AND SEMICONDUCTOR DEVICE

(71) Applicant: Panasonic Intellectual Property Management Co., Ltd., Osaka (JP)

(72) Inventors: Hiroshi Koshida, Osaka (JP); Shinzo Koyama, Osaka (JP); Tatsuya Kabe, Osaka (JP); Masaki Tamaru, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 394 days.

(21) Appl. No.: 18/299,007

(22) Filed: Apr. 11, 2023

(65) Prior Publication Data

US 2023/0244262 A1    Aug. 3, 2023

Related U.S. Application Data

(63) Continuation of application No. PCT/JP2021/031083, filed on Aug. 25, 2021.

(30) Foreign Application Priority Data

Oct. 27, 2020    (JP) ................................ 2020-179346

(51) Int. Cl.
  *G05F 3/26*    (2006.01)
  *G01J 1/44*    (2006.01)
  *H10D 84/60*    (2025.01)

(52) U.S. Cl.
  CPC ................ *G05F 3/265* (2013.01); *G01J 1/44* (2013.01); *G01J 2001/4466* (2013.01); *H10D 84/645* (2025.01)

(58) Field of Classification Search
  CPC .... G05F 3/265; G05F 3/30; G01J 1/44; G01J 2001/4466; G01J 2001/444; H10D 84/645; H10D 84/617; H10D 84/406; H10F 77/959
  See application file for complete search history.

(56) References Cited

U.S. PATENT DOCUMENTS

2009/0261896 A1 * 10/2009 Tzu-Chien ......... H03K 19/0016
                                                                   327/543

FOREIGN PATENT DOCUMENTS

| JP | 2003078021 A | * | 3/2003 |
| JP | 2008263195 A | * | 10/2008 |
| JP | 2009044002 A | * | 2/2009 |
| JP | 4238739 B2 | | 3/2009 |
| JP | 2019-153175 A | | 9/2019 |

OTHER PUBLICATIONS

International Search Report issued on Oct. 26, 2021 in International Patent Application No. PCT/JP2021/031083, with English translation.

* cited by examiner

*Primary Examiner* — Ermias T Woldegeorgis
(74) *Attorney, Agent, or Firm* — Rimon P.C.

(57) ABSTRACT

A substrate current suppression circuit includes: a fixed voltage line that supplies a fixed voltage to the collectors of the third and fourth transistors. The fixed voltage is a voltage higher than the base voltage of the third and fourth transistors when the first polarity is p type, and is a voltage lower than the base voltage when the first polarity is n type.

9 Claims, 7 Drawing Sheets

SUBSTRATE CURRENT SUPPRESSION CIRCUIT, REFERENCE VOLTAGE GENERATION CIRCUIT, AND SEMICONDUCTOR DEVICE

CROSS REFERENCE TO RELATED APPLICATIONS

This is a continuation application of PCT International Application No. PCT/JP2021/031083 filed on Aug. 25, 2021, designating the United States of America, which is based on and claims priority of Japanese Patent Application No. 2020-179346 filed on Oct. 27, 2020. The entire disclosures of the above-identified applications, including the specifications, drawings and claims are incorporated herein by reference in their entirety.

FIELD

The present disclosure relates to a substrate current suppression circuit, a reference voltage generation circuit, and a semiconductor device.

BACKGROUND

Conventionally, bandgap reference circuits (BGR circuits) are widely used as circuits that generate reference voltages.

Patent Literature (PTL) 1 and PTL 2 each disclose a circuit that generates a reference voltage utilizing a difference in band gap between two diodes of the same type or two bipolar transistors of the same type that are diode connected. Such a circuit corrects fluctuations due to temperature properties and fluctuations in power supply voltage, and thus enhances reference voltage accuracy.

CITATION LIST

Patent Literature

PTL 1: Japanese Unexamined Patent Application Publication No. 2019-153175
PTL 2: Japanese Patent No. 4238739

SUMMARY

Technical Problem

Unfortunately, there is a problem that unnecessary substrate current may be generated in the case where a reference voltage generation circuit is formed in a semiconductor substrate.

The present disclosure provides a substrate current suppression circuit, a reference voltage generation circuit, and a semiconductor device that suppress the generation of unnecessary substrate current.

Solution to Problem

A substrate current suppression circuit according to one aspect of the present disclosure includes: a semiconductor substrate of the first polarity, where the semiconductor substrate includes the first principal surface and the second principal surface on opposite sides; the first transistor, the second transistor, the third transistor, and the fourth transistor on the first principal surface side of the semiconductor substrate; and a fixed voltage line that supplies a fixed voltage to the collector of the third transistor and the collector of the fourth transistor. Each of the collector of the first transistor and the collector of the second transistor is connected to a substrate region of the first polarity on the second principal surface side in the semiconductor substrate. The polarity of the third transistor is opposite to the polarity of the first transistor. The polarity of the fourth transistor is opposite to the polarity of the second transistor. The fixed voltage is a voltage higher than the base voltage of the third transistor and the fourth transistor when the first polarity is p type, and is a voltage lower than the base voltage when the first polarity is n type.

A reference voltage generation circuit according to one aspect of the present disclosure includes: the above-described substrate current suppression circuit; and a bandgap reference circuit including the substrate current suppression circuit.

A reference voltage generation circuit according to one aspect of the present disclosure includes: the above-described substrate current suppression circuit; a current source that generates current that is in accordance with a control signal; the first resistor that connects the current source and the base of the third transistor; the second resistor and the third resistor that connect the current source and the base of the fourth transistor and are connected to each other in series; a differential amplifier that (i) detects the difference between the base voltage of the third transistor and a voltage at a connection point between the second resistor and the third resistor, and (ii) feeds back the control signal indicating the difference to the current source; and an output terminal that outputs a voltage at a connection point between the current source and the first resistor as a reference voltage.

A semiconductor device according to one aspect of the present disclosure includes: the above-described reference voltage generation circuit; and an avalanche photodiode in the semiconductor substrate.

These generic or specific aspects may be realized by a system, an integrated circuit, or any combination thereof.

Advantageous Effects

With the substrate current suppression circuit, the reference voltage generation circuit, and the semiconductor device according to the present disclosure, the generation of unnecessary substrate current can be suppressed.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS (Underlying Knowledge Forming Basis of the Present Disclosure)

The inventors have found that the following problems related to the reference voltage generation circuit described in the "Background" section arise. The following describes this point with reference to some of the drawings.

Figure 7A:
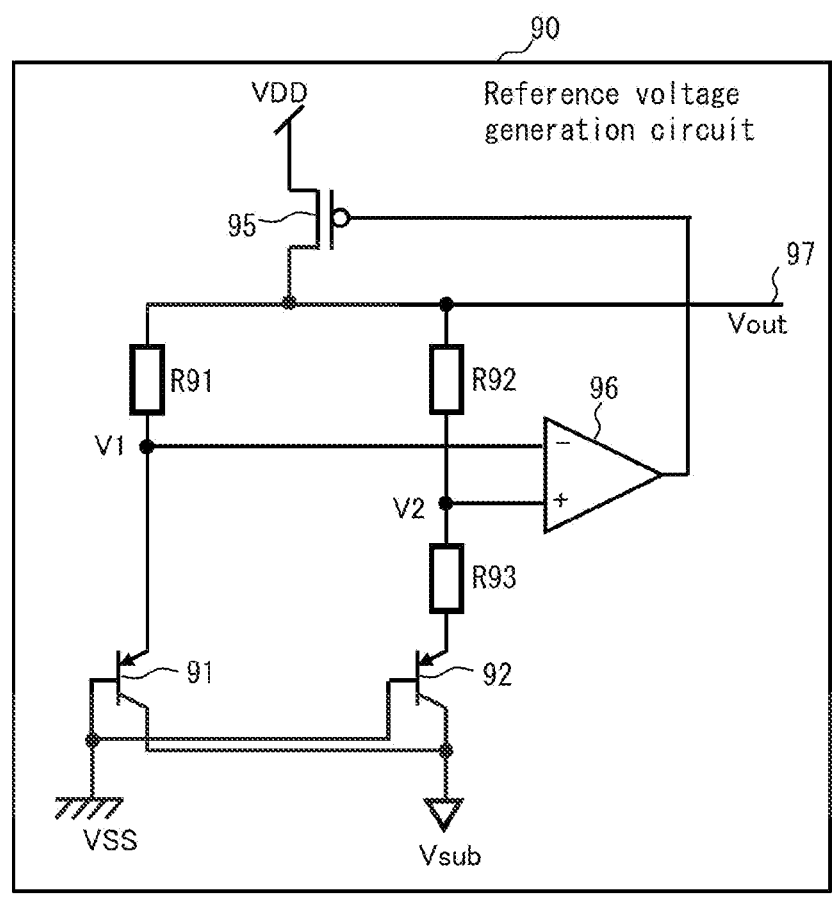
FIG. 7A is a diagram illustrating a reference voltage generation circuit according to Comparative Example 1.
Figure 7B:
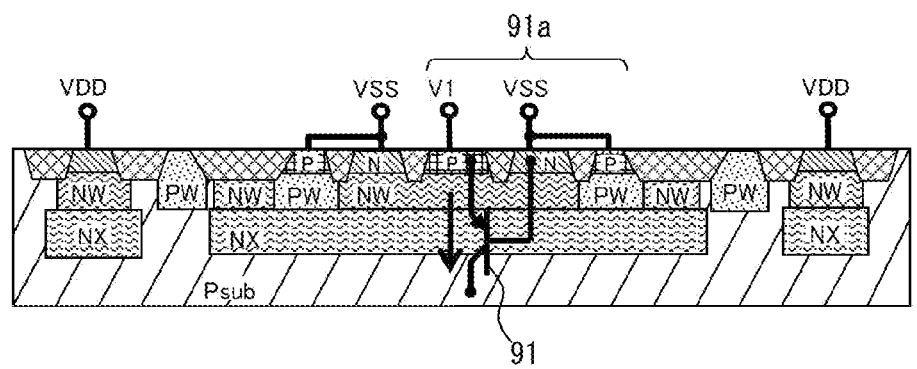
FIG. 7B is an illustration of an example of a partial cross section of a reference voltage generation circuit according to Comparative Example 1.

FIG. 7A is a diagram illustrating reference voltage generation circuit 90 according to Comparative Example 1. FIG. 7B is an illustration of an example of a partial cross section of a reference voltage generation circuit according to Comparative Example 1. Reference voltage generation circuit 90 is configured as a bandgap reference circuit.

In FIG. 7A, reference voltage generation circuit 90 includes PNP transistor 91, PNP transistor 92, current source 95, differential amplifier 96, output terminal 97, and resistors R91 through R93. This reference voltage generation circuit 90 is an example of a circuit formed in a p-type semiconductor substrate. In FIG. 7A, VDD denotes a power line and VSS denotes a ground line. Vsub denotes a substrate voltage, i.e., a voltage to be applied to region Psub on the semiconductor substrate rear surface side in FIG. 7B.

An operation of generating a reference voltage in reference voltage generation circuit 90 is omitted here since the operation is same as that described in a prior art document such as PTL 1 or PTL 2.

FIG. 7B schematically illustrates a cross section of part of reference voltage generation circuit 90 formed in the semiconductor substrate, i.e., a circuit part including PNP transistor 91. Region Psub in FIG. 7B is a p-type region in the semiconductor substrate. Region N is an n-type contact region in the surface of the semiconductor substrate. Region NW is an n-type well region. Region NX is an n-type buried region. Region P is a p-type contact region in the surface of the semiconductor substrate. Region PW is a p-type well region. Region PX is a p-type buried region.

As illustrated in FIG. 7B, the emitter of PNP transistor 91 is equivalent to contact region P to which voltage V1 is applied. The base of PNP transistor 91 is equivalent to buried region NX, well region NW, and contact region N to which voltage VSS is applied. The collector of PNP transistor 91 is equivalent to p-type region Psub.

FIG. 7B illustrates, although not clearly shown in FIG. 7A, PNP transistor 91a that is diode connected. PNP transistor 91a includes an emitter and a base which are shared in common with PNP transistor 91. The collector of PNP transistor 91a is equivalent to contact region P to which voltage VSS is applied. The base and the collector of PNP transistor 91a are connected, i.e., diode connected, to each other.

The relationship between PNP transistor 91 and PNP transistor 91a will be described.

When the potential of region Psub is, for example, the potential of voltage VSS or higher, PNP transistor 91a normally functions as a diode that constitutes reference voltage generation circuit 90 to which PNP transistor 91a is diode connected. In this case, PNP transistor 91 is a parasitic transistor, and is ignorable or functions in the same manner as PNP transistor 91a.

When the potential of region Psub is lower than the potential of voltage VSS, unnecessary substrate current from the emitter to collector of PNP transistor 91 may be generated, as schematically illustrated in FIG. 7B. In this case, since such unnecessary substrate current flows, current no longer flows to PNP transistor 91a and PNP transistor 91a no longer functions substantially as a diode. There is a problem that unnecessary substrate current flowing to PNP transistor 91 may cause malfunction in reference voltage generation circuit 90.

The same problem as that arises in the case of PNP transistor 91 arises also in the case of PNP transistor 92 in FIG. 7A.

The following describes an example in which this problem may arise more notably.

Figure 7C:
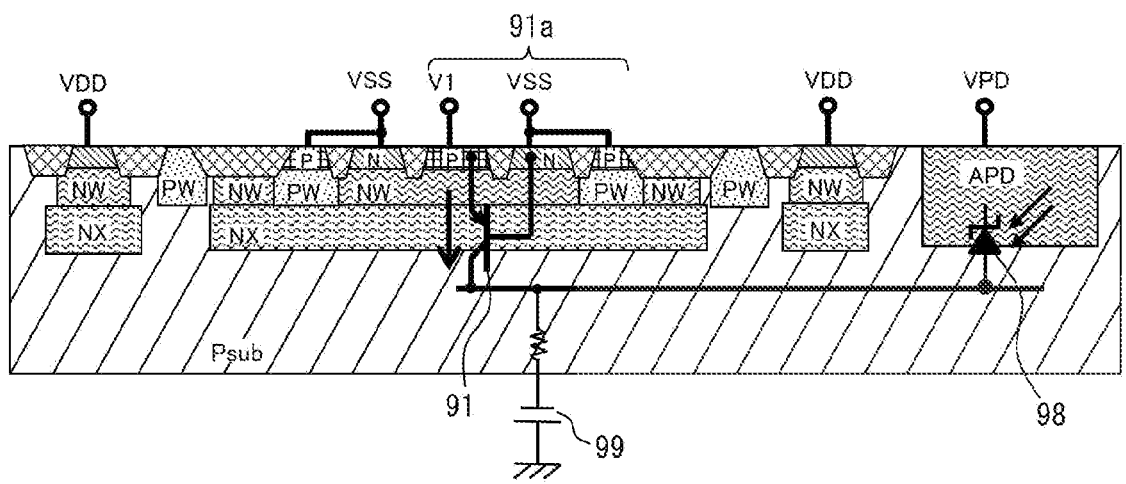
FIG. 7C is an illustration of another example of a partial cross section of a reference voltage generation circuit according to Comparative Example 1.

FIG. 7C is an illustration of another example of a partial cross section of a reference voltage generation circuit according to Comparative Example 1. FIG. 7C is different from FIG. 7B in that avalanche photodiode APD and power supply 99 are added to the semiconductor substrate.

A reverse bias voltage of approximately 20 volts is applied to avalanche photodiode APD by power supply 99. In other words, a high negative voltage is applied to region Psub on the semiconductor substrate rear surface side by power supply 99, as illustrated in FIG. 7C. There is a problem that this negative voltage increases the amount of unnecessary substrate current flowing to PNP transistor 91 more than the case illustrated in FIG. 7B. This substrate current causes malfunction in reference voltage generation circuit 90 and avalanche photodiode APD.

The following describes this problem using Comparative Example 2.

Figure 8A:
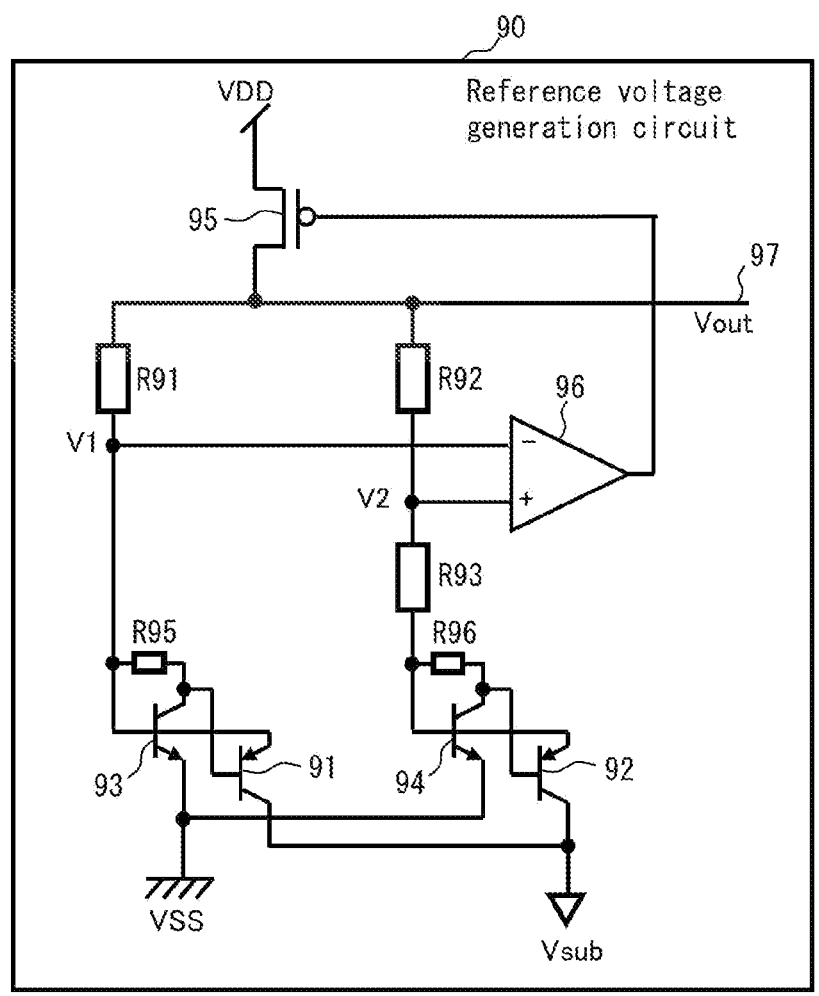
FIG. 8A is a diagram illustrating a reference voltage generation circuit according to Comparative Example 2.
Figure 8B:
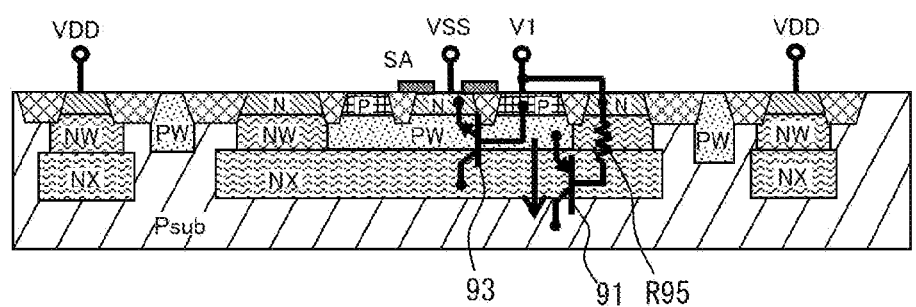
FIG. 8B is an illustration of an example of a partial cross section of a reference voltage generation circuit according to Comparative Example 2.

FIG. 8A is a diagram illustrating reference voltage generation circuit 90 according to Comparative Example 2. FIG. 8B is an illustration of an example of a partial cross section of reference voltage generation circuit 90 according to Comparative Example 2.

In FIG. 8A, reference voltage generation circuit 90 includes PNP transistor 91, PNP transistor 92, NPN transistor 93, NPN transistor 94, current source 95, differential amplifier 96, output terminal 97, and resistors R91 through R93, R95, and R96. This reference voltage generation circuit 90 is an example of a circuit formed in a p-type semiconductor substrate. The signs such as VDD, VSS, and Vsub are the same as those in FIG. 7A.

As illustrated in FIG. 8B, the emitter of PNP transistor 91 is equivalent to contact region P to which voltage V1 is applied and well region PW. The base of PNP transistor 91 is equivalent to buried region NX, well region NW, and contact region N to which voltage V1 is applied. The collector of PNP transistor 91 is equivalent to region Psub which is the substrate base of a p-type semiconductor region. It can be said that this PNP transistor 91 is a parasitic transistor formed without any intension rather than an indispensable transistor intentionally formed in reference voltage generation circuit 90. When the potential of region Psub is lower than the potential of voltage VSS, unnecessary substrate current from the emitter to collector of PNP transistor 91 may be generated, as schematically illustrated in FIG. 8B.

The emitter of NPN transistor 93 is equivalent to an n-type contact region to which voltage VSS is applied. The base of NPN transistor 93 is equivalent to contact region P to which voltage V1 is applied. The collector of NPN transistor 93 is equivalent to buried region NX. Thus, the base and the collector of NPN transistor 93 are connected to each other via resistor R95 and voltage V1 is applied to the base and the collector of NPN transistor 93. In other words, NPN transistor 93 is diode connected.

The following describes the relationship between PNP transistor 91 and NPN transistor 93.

NPN transistor 93 functions as a diode. PNP transistor 91, on the other hand, is a parasitic transistor.

When the potential of region Psub is lower than the potential of voltage VSS, unnecessary substrate current from the emitter to collector of PNP transistor 91 may be generated, as schematically illustrated in FIG. 8B. There is a problem that such unnecessary substrate current may cause malfunction in reference voltage generation circuit 90.

The same problem as that arises in the case of PNP transistor 91 arises also in the case of PNP transistor 92.

Furthermore, the following describes an example in which this problem may arise more notably.

Figure 8C:
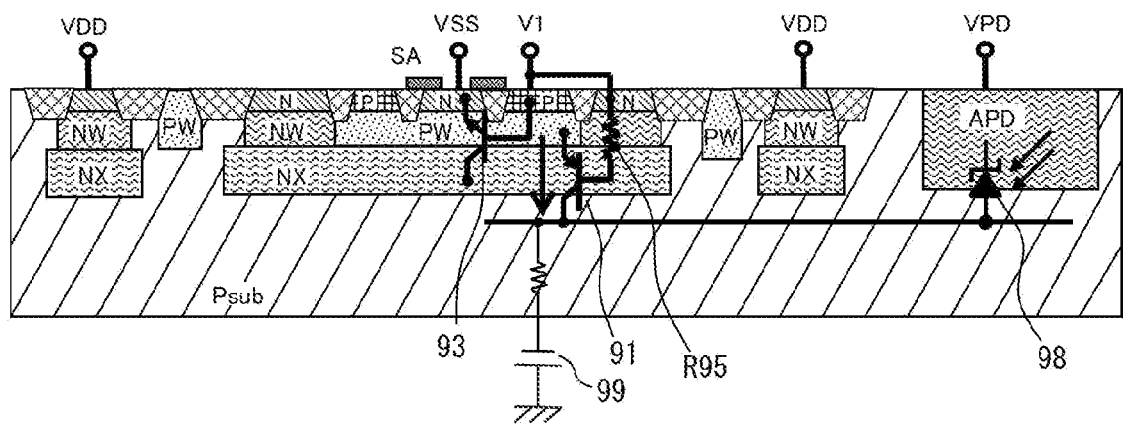
FIG. 8C is an illustration of another example of a partial cross section of a reference voltage generation circuit according to Comparative Example 2.

FIG. 8C is an illustration of another example of a partial cross section of a reference voltage generation circuit according to Comparative Example 2. The circuit configuration in FIG. 8C is different from the circuit configuration in FIG. 8B in that avalanche photodiode APD and power supply 99 are added to the semiconductor substrate. There is a problem that unnecessary substrate current flowing through PNP transistor 91 increases also in the circuit configuration in FIG. 8C, as is the case of FIG. 7C, more than in the circuit configuration in FIG. 8B. This substrate current causes malfunction in reference voltage generation circuit 90 and avalanche photodiode APD.

In view of this, the present disclosure provides, for instance, a substrate current suppression circuit, a reference voltage generation circuit, a semiconductor device that suppress the generation of unnecessary substrate current.

In order to solve the problems as described above, a substrate current suppression circuit according to one aspect of the present disclosure includes: a semiconductor substrate of the first polarity, the semiconductor substrate including the first principal surface and the second principal surface on opposite sides; the first transistor, the second transistor, the third transistor, and the fourth transistor on the first principal surface side of the semiconductor substrate; and a fixed voltage line that supplies a fixed voltage to the collector of the third transistor and the collector of the fourth transistor. Each of the collector of the first transistor and the collector of the second transistor is connected to a substrate region of the first polarity on the second principal surface side in the semiconductor substrate. The polarity of the third transistor is opposite to the polarity of the first transistor. The polarity of the fourth transistor is opposite to the polarity of the second transistor. The fixed voltage is a voltage higher than the base voltage of the third transistor and the fourth transistor when the first polarity is p type, and is a voltage lower than the base voltage when the first polarity is n type.

As used herein, the expression "the polarity of the third transistor is opposite to the polarity of the first transistor" means that the polarity of the base of the third transistor is opposite to the polarity of the base of the first transistor. In other words, one of the third transistor and the first transistor is an NPN transistor and the other is a PNP transistor.

A reference voltage generation circuit according to one aspect of the present disclosure includes: the above-described substrate current suppression circuit; and a bandgap reference circuit including the substrate current suppression circuit.

A semiconductor device according to one aspect of the present disclosure includes: the above-described reference voltage generation circuit; and an avalanche photodiode in the semiconductor substrate.

With the substrate current suppression circuit, the reference voltage generation circuit, and the semiconductor device described above, the generation of unnecessary substrate current can be suppressed.

These generic or specific aspects may be realized by a system, an integrated circuit, or any combination thereof.

Hereinafter, embodiments will be described with reference to the drawings.

The embodiments described below each present a general or specific example. The numerical values, shapes, materials, elements, the arrangement and connection of the elements, etc., described in the following embodiments are mere examples, and therefore are not intended to limit the present disclosure.

Embodiment 1

Figure 1:
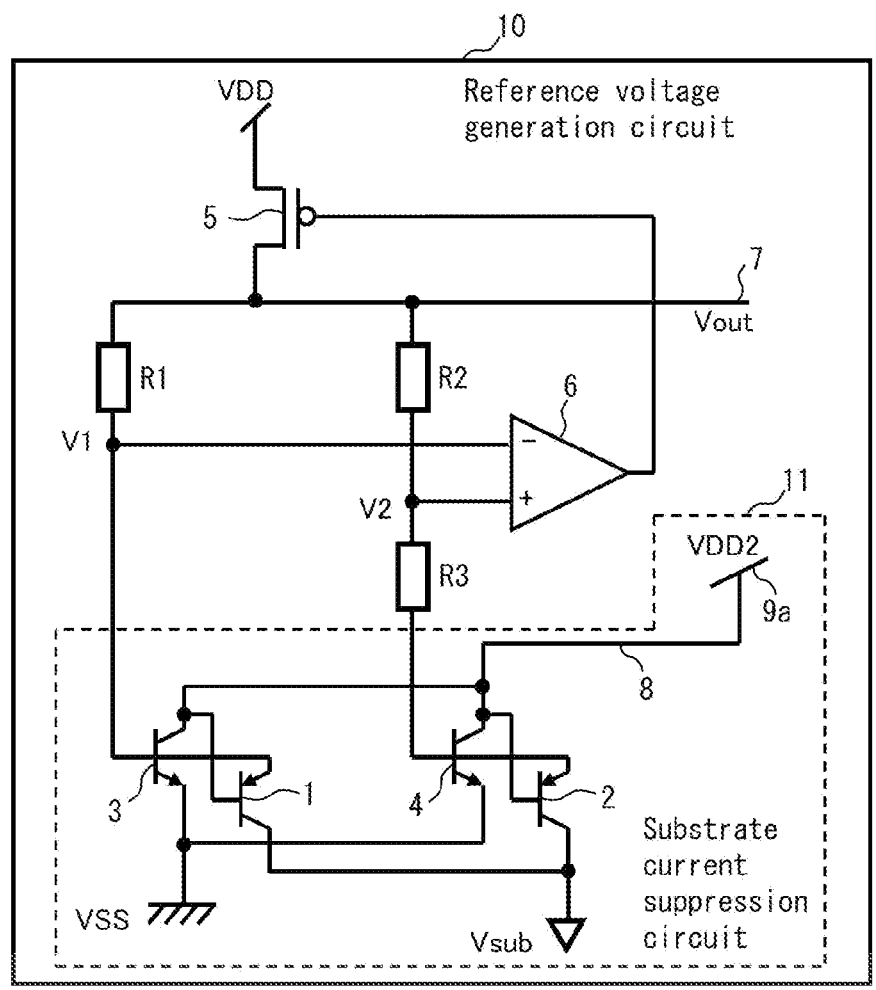
FIG. 1 is a diagram illustrating a configuration example of a reference voltage generation circuit that includes a substrate current suppression circuit according to Embodiment 1.
Figure 2:
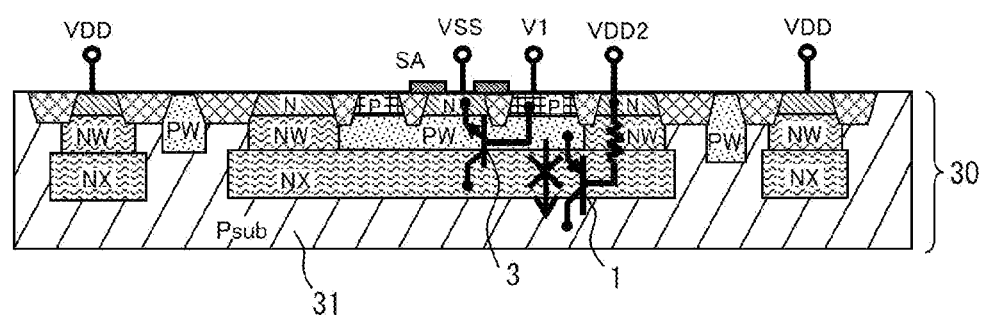
FIG. 2 is an illustration of an example of a partial cross section of a substrate current suppression circuit according to Embodiment 1.

FIG. 1 is a diagram illustrating a configuration example of reference voltage generation circuit 10 that includes substrate current suppression circuit 11 according to Embodiment 1. FIG. 2 is an illustration of an example of a partial cross section of a substrate current suppression circuit according to Embodiment 1. Reference voltage generation circuit 10 is configured as a bandgap reference circuit.

In FIG. 1, reference voltage generation circuit 10 includes substrate current suppression circuit 11, current source 5, differential amplifier 6, output terminal 7, and resistors R1, R2, and R3. As illustrated in FIG. 2, this reference voltage generation circuit 10 is an example of a circuit formed in semiconductor substrate 30 of the first polarity. FIG. 2 illustrates semiconductor substrate 30 in the case where the first polarity is p type. In FIG. 1, VDD denotes a power line and VSS denotes a ground line. Vsub denotes a substrate voltage, i.e., a voltage to be applied to region Psub on the semiconductor substrate rear surface side in FIG. 2.

First, substrate current suppression circuit 11 will be described.

As illustrated in FIG. 1, substrate current suppression circuit 11 includes first transistor 1, second transistor 2, third transistor 3, fourth transistor 4, fixed voltage line 8, and fixed voltage source 9a.

Each of first transistor 1 through fourth transistor 4 is formed on the first principal surface side of semiconductor substrate 30. The first principal surface of semiconductor substrate 30 is a substrate surface on the side where first transistor 1 and others are formed. The second principal surface is a substrate surface of semiconductor substrate 30 on the opposite side relative to the first principal surface.

Each of first transistor 1 and second transistor 2 is a PNP transistor.

The collector of first transistor 1 is connected to substrate region 31. Stated differently, the collector of first transistor 1 and substrate region 31 are not separate components and the collector of first transistor 1 is the whole or part of substrate region 31.

The collector of second transistor 2 is connected to substrate region 31. Stated differently, the collector of second transistor 2 and substrate region 31 are not separate components and the collector of second transistor 2 is the whole or part of substrate region 31.

The polarity of third transistor 3 is opposite to the polarity of first transistor 1 and third transistor 3 is an NPN transistor. In other words, first transistor 1 is a PNP transistor whereas third transistor 3 is an NPN transistor. The collector of third transistor 3 is connected to the base of first transistor 1.

The base of third transistor 3 is connected to the emitter of first transistor 1.

The collector of third transistor 3 is connected to fixed voltage line 8 that supplies a fixed voltage.

The polarity of fourth transistor 4 is opposite to the polarity of second transistor 2 and fourth transistor is an NPN transistor. In other words, second transistor 2 is a PNP transistor whereas fourth transistor 4 is an NPN transistor. The collector of fourth transistor 4 is connected to the base of second transistor 2.

The base of fourth transistor 4 is connected to the emitter of second transistor 2.

The collector of fourth transistor 4 is connected to fixed voltage line 8 that supplies a fixed voltage.

Fixed voltage source 9a supplies a fixed voltage to the collector of third transistor 3 and the collector of fourth transistor 4 via fixed voltage line 8. The fixed voltage is voltage VDD2 higher than the base voltage of third transistor 3 and fourth transistor 4 when the first polarity is p type, i.e., in the case illustrated in FIG. 2. If the first polarity is n type, the fixed voltage is voltage VSS2 lower than the base voltage. Such fixed voltage completely turns off first transistor 1 and second transistor 2. In other words, unnecessary substrate current is suppressed.

Next, an example of a cross section illustrated in FIG. 2 will be described. FIG. 2 schematically illustrates part of substrate current suppression circuit 11 formed in semiconductor substrate 30, i.e., a cross section of a circuit part including first transistor 1 and third transistor 3. Region Psub in FIG. 2 is substrate region 31 of the first polarity, i.e., p type. Region N is an n-type contact region on the front surface side, i.e., the first principal surface side of semiconductor substrate 30. Region NW is an n-type well region. Region NX is an n-type buried region. Region P is a p-type contact region on the front surface side, i.e., the first principal surface side of semiconductor substrate 30. Region PW is a p-type well region. Region PX is a p-type buried region.

As illustrated in FIG. 2, the emitter of first transistor 1 is equivalent to contact region P to which voltage V1 is applied and well region PW. Stated differently, the emitter of first transistor 1 is the whole or part of the following regions: contact region P to which voltage V1 is applied; and well region PW adjacent to and immediately below region P.

The base of first transistor 1 is equivalent to contact region N to which voltage VDD2 is applied, buried region NX, and well region NW. Stated differently, the base of first transistor 1 is the whole or part of the following regions: contact region N to which voltage VDD2 is applied, buried region NX, and well region NW.

The collector of first transistor 1 is equivalent to substrate region 31 on the second principal surface side of semiconductor substrate 30. Stated differently, the collector of first transistor 1 and substrate region 31 are not separate components and the collector of first transistor 1 is the whole or part of substrate region 31.

This first transistor 1 is a parasitic transistor formed without any intension rather than a transistor intentionally formed. Even when the potential of region Psub is a negative voltage lower than the potential of voltage VSS, first transistor 1 can suppress the generation of unnecessary substrate current from the emitter to collector of first transistor 1, as schematically illustrated in FIG. 2. This is because voltage VDD2 applied to the base of first transistor 1 completely turns off first transistor 1. Voltage VDD2 is higher than voltage V1.

The emitter of third transistor 3 is equivalent to an n-type contact region to which voltage VSS is applied. Stated differently, the emitter of third transistor 3 is the whole or part of the n-type contact region to which voltage VSS is applied.

The base of third transistor 3 is equivalent to contact region P to which voltage V1 is applied and well region PW immediately below contact region P. Stated differently, the base of third transistor 3 is the whole or part of the following regions: contact region P to which voltage V1 is applied; and well region PW immediately below contact region P.

The collector of third transistor 3 is equivalent to contact region N to which voltage VDD2 is applied, buried region NX, and well region NW. Stated differently, the collector of third transistor 3 is the whole or part of the following regions: contact region N to which voltage VDD2 is applied, buried region NX, and well region NW. The collector of third transistor 3 is connected to the base of first transistor 1. Stated differently, a region in semiconductor substrate 30, which is equivalent to the collector of third transistor 3, is also a region equivalent to the base of first transistor 1.

Second transistor 2 and fourth transistor 4 in FIG. 1 may also have the same configurations as first transistor 1 and third transistor 3 in FIG. 2, respectively. Second transistor 2 can suppress the generation of unnecessary substrate current, as is the case of first transistor 1.

The pair of first transistor 1 and third transistor 3 and the pair of second transistor 2 and fourth transistor 4 may each be a circuit pair constituting part of a current mirror circuit. Each of second transistor 2 and fourth transistor 4 may include K parallel transistors. A mirror ratio may be 1 to (1/K). K may be 1 or an integer of 1 or greater.

Next, reference voltage generation circuit 10 will be described.

Reference voltage generation circuit 10 in FIG. 1 includes current source 5, differential amplifier 6, output terminal 7, and resistors R1, R2, and R3, in addition to substrate current suppression circuit 11.

Current source 5 is a current source that generates current that is in accordance with an output signal from differential amplifier 6. Current source 5 in FIG. 1 is configured by a PMOS transistor. The source of the PMOS transistor is connected to voltage VDD. The drain of the PMOS transistor is connected to a reference voltage output line. The reference voltage output line is a wire connected to: output terminal 7 that outputs a reference voltage; one end of resistor R1; and one end of resistor R2. The gate of the PMOS transistor inputs an output signal from differential amplifier 6. Current source 5 may be configured by an NMOS transistor.

Differential amplifier 6 negatively feeds back an output signal indicating the difference between voltage V1 and voltage V2 to the gate of the PMOS transistor. The negative feedback of the output signal, from differential amplifier 6 to current source 5, causes the difference between voltage V1 and voltage V2 to be 0. Voltage V1 and voltage V2 are set so that voltages V1 and V2 fluctuate in a direction opposite to the direction of fluctuations in voltage VDD and temperature fluctuations. In addition, the negative feedback keeps the reference voltage of the reference voltage output line constant.

Output terminal 7 is a terminal that outputs the voltage of the reference voltage output line as a reference voltage.

Resistor R1 defines the current value of a current flowing from current source 5 to the pair of first transistor 1 and third transistor 3. Resistor R1 defines also voltage V1.

Resistor R2 and resistor R3 define the current value of a current flowing from current source 5 to the pair of second transistor 2 and fourth transistor 4. Resistor R2 and resistor R3 are set so that voltage V2, which is a voltage value resulting from dividing a voltage between resistors R2 and R3, is same as voltage V1.

Resistor R1, the pair of first transistor 1 and third transistor 3, resistor R2, resistor R3, and the pair of second transistor 2 and fourth transistor 4 constitute a current mirror circuit. Positive temperature coefficients are set for the temperature properties of the pair of first transistor 1 and third transistor 3. In contrast, negative temperature properties are set for the temperature properties of the pair of second transistor 2 and fourth transistor 4. This suppresses fluctuations dependent on the temperature properties of a reference voltage.

Substrate current suppression circuit 11 may be part of another circuit other than reference voltage generation circuit 10. The other circuit may be, for example, a temperature sensor. The temperature sensor allows the temperature properties of the pair of first transistor 1 and third transistor 3 to have positive temperature coefficients and allows the temperature properties of the pair of second transistor 2 and fourth transistor 4 to have negative temperature coefficients. It is thus possible to utilize an output signal from differential amplifier 6 in FIG. 1 as a signal indicating a temperature.

As described above, substrate current suppression circuit 11 according to Embodiment 1 includes: semiconductor substrate 30 of the first polarity, where semiconductor substrate 30 includes a first principal surface and a second principal surface on opposite sides; first transistor 1, second transistor 2, third transistor 3, and fourth transistor 4 on the first principal surface side of semiconductor substrate 30; and fixed voltage line 8 that supplies a fixed voltage to the collector of third transistor 3 and the collector of fourth transistor 4. Each of the collector of first transistor 1 and the collector of second transistor 2 is connected to substrate region 31 of the first polarity on the second principal surface side in semiconductor substrate 30. The polarity of third transistor 3 is opposite to the polarity of first transistor 1. The polarity of fourth transistor 4 is opposite to the polarity of second transistor 2. The fixed voltage is voltage VDD2 higher than the base voltage of third transistor 3 and fourth transistor 4 when the first polarity is p type, and is voltage VSS2 lower than the base voltage when the first polarity is n type.

According to the above, each of first transistor 1 and second transistor 2 can suppress the generation of unnecessary substrate current.

For example, the collector of third transistor 3 may be connected to the base of first transistor 1, and the base of third transistor 3 may be connected to the emitter of first transistor 1.

For example, the collector of fourth transistor 4 may be connected to the base of second transistor 2, and the base of fourth transistor 4 may be connected to the emitter of second transistor 2.

For example, the first polarity may be p type, each of first transistor 1 and second transistor 2 may be a PNP transistor, and each of third transistor 3 and fourth transistor 4 may be an NPN transistor.

For example, the pair of first transistor 1 and third transistor 3 and the pair of second transistor 2 and fourth transistor 4 may be each a circuit pair constituting part of a current mirror circuit.

According to the above, substrate current suppression circuit 11 can suppress the generation of unnecessary substrate current in a current mirror circuit.

Reference voltage generation 10 according to Embodiment 1 includes: substrate current suppression circuit 11; and a bandgap reference circuit including substrate current suppression circuit 11.

According to the above, the generation of unnecessary substrate current in a bandgap reference circuit can be suppressed.

Moreover, reference voltage generation circuit 10 according to Embodiment 1 includes: substrate current suppression circuit 11; current source 5 that generates current that is in accordance with a control signal; resistor R1 (the first resistor) that connects current source 5 and the base of third transistor 3; resistor R2 (the second resistor) and resistor R3 (the third resistor) that connect current source 5 and the base of fourth transistor 4 and are connected to each other in series; differential amplifier 6 that (i) detects the difference between the base voltage of third transistor 3 and a voltage at a connection point between resistor R2 and resistor R3, and (ii) feeds back the control signal indicating the difference to current source 5; and output terminal 7 that outputs a voltage at a connection point between current source 5 and resistor R1 as a reference voltage.

According to the above, the generation of unnecessary substrate current can be suppressed in reference voltage generation circuit 10.

For example, semiconductor substrate 30 may include a substrate terminal that applies a substrate voltage to the second principal surface, and the substrate voltage may be a negative voltage when the first polarity is p type, and may be a positive voltage when the first polarity is n type.

Embodiment 2

Embodiment 2 describes a substrate current suppression circuit, a reference voltage generation circuit, and a semiconductor device that use a semiconductor substrate whose polarity is opposite to the polarity of the semiconductor substrate according to Embodiment 1 and transistors whose polarities are opposite to the polarities of the transistors described in Embodiment 1.

Figure 3:
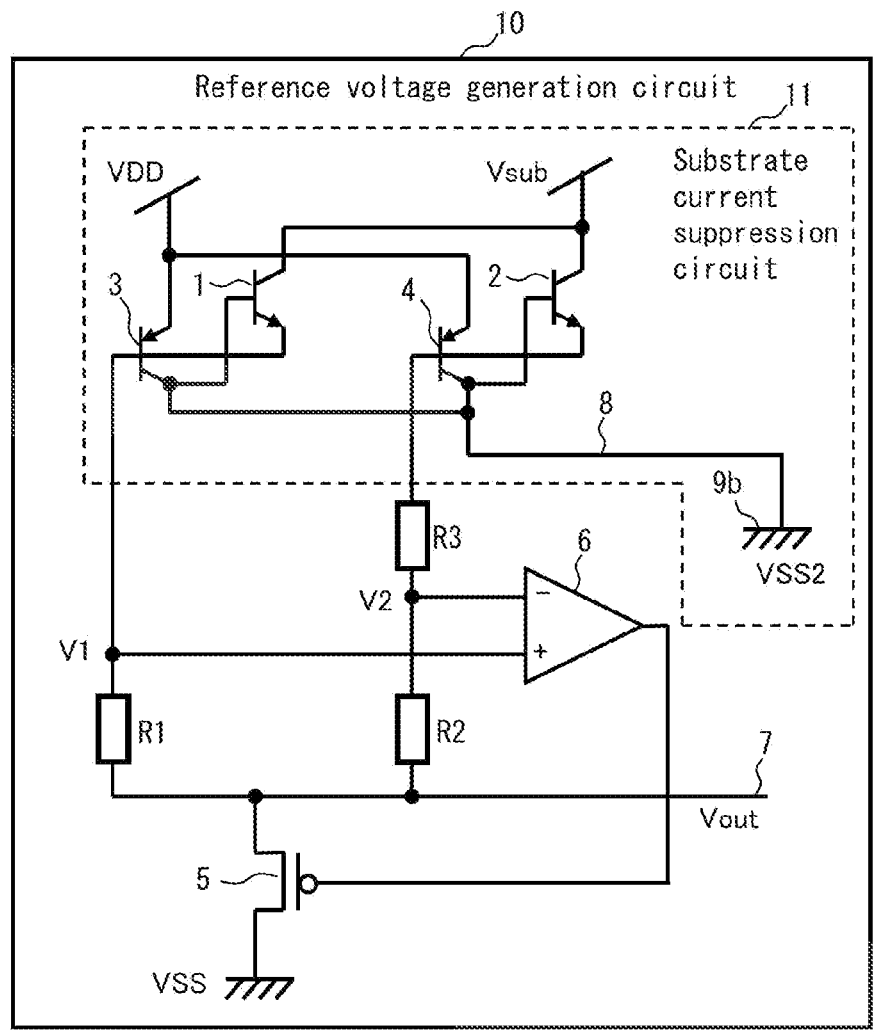
FIG. 3 is a diagram illustrating a configuration example of a reference voltage generation circuit that includes a substrate current suppression circuit according to Embodiment 2.
Figure 4:
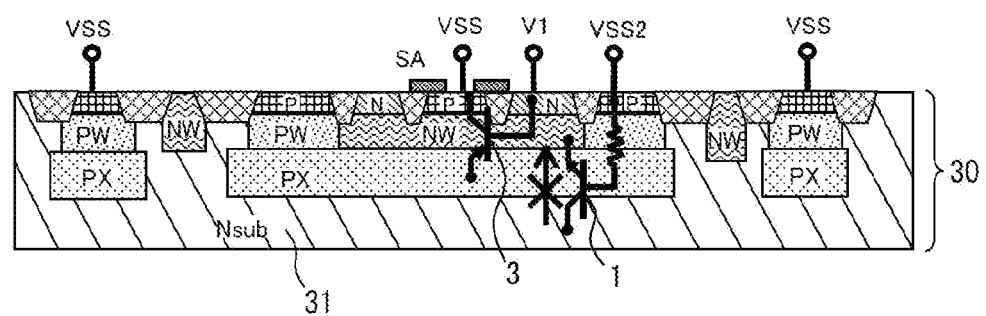
FIG. 4 is an illustration of an example of a partial cross section of a substrate current suppression circuit according to Embodiment 2.

FIG. 3 is a diagram illustrating a configuration example of reference voltage generation circuit 10 that includes substrate current suppression circuit 11 according to Embodiment 2. FIG. 4 is an illustration of an example of a partial cross section of substrate current suppression circuit 11 according to Embodiment 2.

FIG. 3 is mainly different from FIG. 1 in the following points: the polarity of the semiconductor substrate and the polarities of the transistors in FIG. 3 are opposite to the polarity of the semiconductor substrate and the polarities of the transistors in FIG. 1; and fixed voltage source 9a is replaced with fixed voltage source 9b. The following focuses on the differences.

In FIG. 3 and FIG. 4, semiconductor substrate 30 is an n-type, not a p-type, semiconductor substrate. Each of first transistor 1 and second transistor 2 is an NPN transistor. Each of third transistor 3 and fourth transistor 4 is a PNP transistor. For this reason, the polarity of a voltage to be applied to semiconductor substrate 30 and these transistors is also opposite to the polarity of a voltage applied to the semiconductor substrate and the transistors in FIG. 1 and FIG. 2.

Fixed voltage source 9b supplies a fixed voltage to the collector of third transistor 3 and the collector of fourth transistor 4 via fixed voltage line 8. The fixed voltage is voltage VSS2 lower than the base voltage of third transistor 3 and fourth transistor 4 when the first polarity is n type as in FIG. 4.

As described above, substrate current suppression circuit 11 according to Embodiment 2 includes: semiconductor substrate 30 of the first polarity, where semiconductor substrate 30 includes the first principal surface and the second principal surface on opposite sides; first transistor 1, second transistor 2, third transistor 3, and fourth transistor 4 on the first principal surface side of semiconductor substrate 30; and fixed voltage line 8 that supplies a fixed voltage to the collector of third transistor 3 and the collector of fourth transistor 4. Each of the collector of first transistor 1 and the collector of second transistor 2 is connected to substrate region 31 of the first polarity on the second principal surface side in semiconductor substrate 30. The polarity of third transistor 3 is opposite to the polarity of first transistor 1. The polarity of fourth transistor 4 is opposite to the polarity of second transistor 2. The fixed voltage is voltage VDD2 higher than the base voltage of third transistor 3 and fourth transistor 4 when the first polarity is p type, and is voltage VSS2 lower than the base voltage when the first polarity is n type.

According to the above, each of first transistor 1 and second transistor 2 can suppress the generation of unnecessary substrate current.

For example, the collector of third transistor 3 may be connected to the base of first transistor 1 and the base of third transistor 3 may be connected to the emitter of first transistor 1.

For example, the collector of fourth transistor 4 may be connected to the base of second transistor 2 and the base of fourth transistor 4 may be connected to the emitter of second transistor 2.

For example, the first polarity may be n type, each of first transistor 1 and second transistor 2 may be an NPN transistor, and each of third transistor 3 and fourth transistor 4 may be a PNP transistor.

Embodiment 3

Embodiment 3 describes a configuration example of a semiconductor device that includes reference voltage generation circuit 10 according to Embodiment 1.

Figure 5:
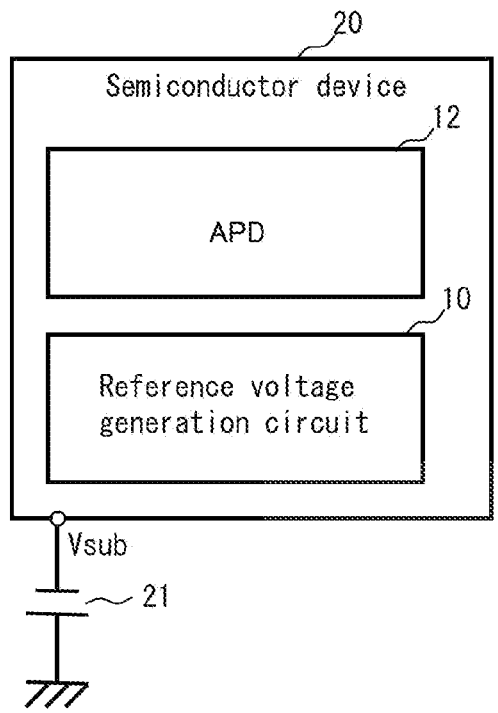
FIG. 5 is a diagram illustrating a configuration example of a semiconductor device according to Embodiment 3.
Figure 6:
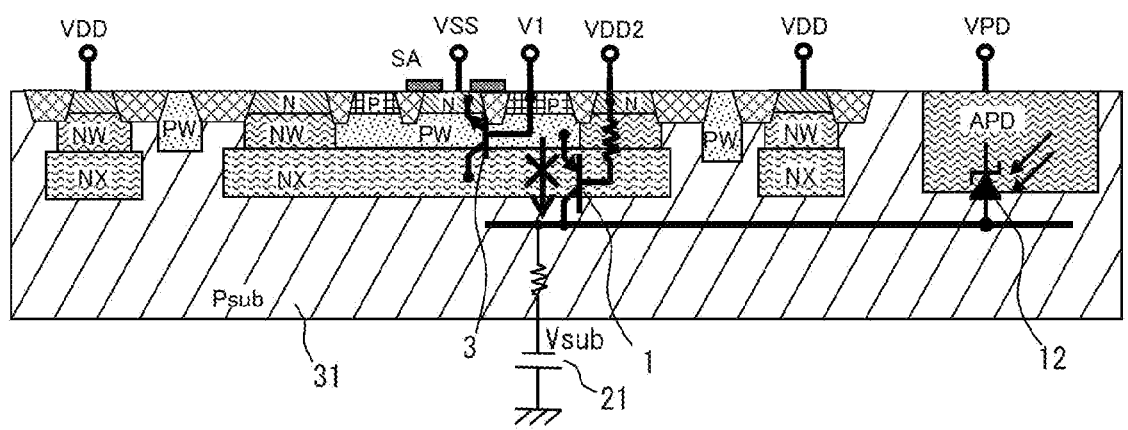
FIG. 6 is an illustration of an example of a cross section of a semiconductor device according to Embodiment 3.

FIG. 5 is a diagram illustrating a configuration example of a semiconductor device according to Embodiment 3. FIG. 6 is an illustration of an example of a cross section of a semiconductor device according to Embodiment 3.

Semiconductor device 20 in FIG. 5 includes reference voltage generation circuit 10 and APD 12. Power supply 21 is also illustrated in FIG. 5.

Reference voltage generation circuit 10 may be same as that described with reference to FIG. 1 in Embodiment 1.

APD 12, which is an avalanche photodiode, generates electric charges by photon incidence and has a Geiger multiplication mode of multiplying an electric charge generated by avalanche effect. The Geiger multiplication mode requires a predetermined reverse bias voltage (e.g., twenty-some volts). APD 12 also has a linear operation mode of generating electric charges proportional to incident photons. The Geiger multiplication mode requires a reverse bias voltage different from that required in the linear operation mode.

In order to supply a reverse bias voltage to APD 12, power supply 21 applies substrate voltage Vsub to the rear surface of semiconductor substrate 30, i.e., the substrate terminal or substrate electrode of the second principal surface.

As described above, the semiconductor device according to Embodiment 3 includes reference voltage generation circuit 10 and avalanche photodiode APD formed in semiconductor substrate 30.

With the semiconductor device according to Embodiment 3, the generation of unnecessary substrate current can be suppressed.

Reference voltage generation circuit 10 in FIG. 5 may be reference voltage generation circuit 10 according to Embodiment 2. In this case, the polarities of APD 12 and power supply 21 may be opposite to those of APD 12 and power supply 21 according to the present embodiment.

In each of the embodiments described above, each of elements may be configured by dedicated hardware.

Although the substrate current suppression circuit, the reference voltage generation circuit, and the semiconductor device according to one or more aspects of the present disclosure have been described based on embodiments, the present disclosure is not limited to these embodiments. Embodiments achieved by applying various modifications conceived by a person skilled in the art to the embodiments as well as embodiments achieved by discretionarily combining elements from different embodiments may be also included in the range of the one or more aspects of the present disclosure, so long as they do not depart from the spirit of the present disclosure.

INDUSTRIAL APPLICABILITY

The present disclosure can be used for substrate current suppression circuits, reference voltage generation circuits, and semiconductor devices, and can be used for, for example, imaging devices.

The invention claimed is:
1. A substrate current suppression circuit comprising:
a semiconductor substrate of a first polarity, the semiconductor substrate including a first principal surface and a second principal surface on opposite sides;
a first transistor, a second transistor, a third transistor, and a fourth transistor on a first principal surface side of the semiconductor substrate; and
a fixed voltage line that supplies a fixed voltage to a collector of the third transistor and a collector of the fourth transistor, wherein
each of a collector of the first transistor and a collector of the second transistor is connected to a substrate region of the first polarity on a second principal surface side in the semiconductor substrate,
a polarity of the third transistor is opposite to a polarity of the first transistor, a polarity of the fourth transistor is opposite to a polarity of the second transistor, and the fixed voltage is a voltage higher than a base voltage of the third transistor and the fourth transistor when the first polarity is p type, and is a voltage lower than the base voltage when the first polarity is n type.

2. A reference voltage generation circuit comprising:

the substrate current suppression circuit according to claim 1; and a bandgap reference circuit including the substrate current suppression circuit.

3. The reference voltage generation circuit according to claim 2, wherein the semiconductor substrate includes a substrate terminal that applies a substrate voltage to the second principal surface, and the substrate voltage is a negative voltage when the first polarity is p type, and is a positive voltage when the first polarity is n type.

4. A semiconductor device comprising:

the reference voltage generation circuit according to claim 2; and an avalanche photodiode in the semiconductor substrate.

5. The substrate current suppression circuit according to claim 1, wherein the collector of the third transistor is connected to a base of the first transistor, and a base of the third transistor is connected to an emitter of the first transistor.

6. The substrate current suppression circuit according to claim 1, wherein the collector of the fourth transistor is connected to a base of the second transistor, and a base of the fourth transistor is connected to an emitter of the second transistor.

7. The substrate current suppression circuit according to claim 1, wherein the first polarity is p type, each of the first transistor and the second transistor is a PNP transistor, and each of the third transistor and the fourth transistor is an NPN transistor.

8. The substrate current suppression circuit according to claim 1, wherein a pair of the first transistor and the third transistor and a pair of the second transistor and the fourth transistor are each a circuit pair constituting part of a current mirror circuit.

9. A reference voltage generation circuit comprising:

the substrate current suppression circuit according to claim 1;

a current source that generates current that is in accordance with a control signal;

a first resistor that connects the current source and a base of the third transistor;

a second resistor and a third resistor that connect the current source and a base of the fourth transistor and are connected to each other in series;

a differential amplifier that (i) detects a difference between the base voltage of the third transistor and a voltage at a connection point between the second resistor and the third resistor, and (ii) feeds back the control signal indicating the difference to the current source; and an output terminal that outputs a voltage at a connection point between the current source and the first resistor as a reference voltage.

* * * * *